United States Patent
Werner, Jr. et al.

(10) Patent No.: US 6,806,717 B2
(45) Date of Patent: Oct. 19, 2004

(54) SPACING COMPENSATING ELECTROSTATIC VOLTMETER

(75) Inventors: Alan J. Werner, Jr., Rochester, NY (US); Fred F. Hubble, III, Rochester, NY (US); Stanley J. Wallace, Victor, NY (US); R. Enrique Viturro, Rochester, NY (US); Eric Peeters, Fremont, CA (US); Joel A. Kubby, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 40 days.

(21) Appl. No.: 10/225,555

(22) Filed: Aug. 21, 2002

(65) Prior Publication Data

US 2003/0057977 A1 Mar. 27, 2003

Related U.S. Application Data

(60) Provisional application No. 60/325,282, filed on Sep. 27, 2001.

(51) Int. Cl.[7] ............... G01R 29/12; G01R 27/26
(52) U.S. Cl. ............. 324/458; 324/663; 324/665; 324/713
(58) Field of Search ............... 324/457, 458, 324/658, 661, 663, 665, 713; 399/73

(56) References Cited

U.S. PATENT DOCUMENTS

| | | | | | |
|---|---|---|---|---|---|
| 3,997,839 | A | * | 12/1976 | Dreyfus et al. | 324/109 |
| 4,106,869 | A | * | 8/1978 | Buchheit | 399/73 |
| 4,614,908 | A | * | 9/1986 | Daniele et al. | 324/458 |
| 5,025,346 | A | | 6/1991 | Tang et al. | 361/283 |
| 5,517,123 | A | | 5/1996 | Zhao et al. | 324/458 |
| 6,177,800 | B1 | | 1/2001 | Kubby et al. | 324/458 |

* cited by examiner

*Primary Examiner*—Vincent Q. Nguyen
(74) *Attorney, Agent, or Firm*—Lloyd F. Bean, II

(57) ABSTRACT

An electrostatic type voltmeter for measuring the potential on a surface, the voltmeter including a probe; a support for supporting the probe in spaced relationship with the surface, the probe having a plurality of spacing element sites thereon for measuring a distance between each of the plurality of spacing element sites and a corresponding area on the surface opposite of each of the plurality of spacing element sites; a plurality of electrostatic element sites, intermixed and adjacent to the plurality of spacing element sites on the probe, for measuring a voltage between each of the plurality of spacing element sites and an area on the surface adjacent to the corresponding area opposite of each of the plurality of spacing element sites. A processor for compensating an output signal of the probe in response to the measurements received from the plurality of spacing element sites and the plurality of electrostatic element sites.

9 Claims, 6 Drawing Sheets

SPACING COMPENSATING ELECTROSTATIC VOLTMETER

This application is based on a Provisional Application No. 60/325,282, filed Sep. 27, 2001.

This invention relates generally to an electrostatographic printing machine and more particularly, concerns a method and an apparatus for monitoring voltages on a photoreceptor in an electrophotographic printing machine.

INCORPORATED BY REFERENCE

The following U.S. Pat. are specifically incorporated by reference U.S. Pat. No. 6,177,800, filed Jan. 23, 2001, entitled "Method and Apparatus for Using a Shuttered Windows in a Micro Electro-Mechanical System," by Kubby et al.; U.S. Pat. No. 5,517,123, filed May 14, 1996, entitled "High Sensitivity Integrated Micro Mechanical Electrostatical Potential Sensor," by Zhao et al.; and U.S. Pat. No. 5,025,346, filed Jun. 18, 1991, entitled "Laterally Driven Resonant Microstructures," by Tang et al.

BACKGROUND AND SUMMARY

The basic reprographic process used in an electrostatographic printing machine generally involves an initial step of charging a photoconductive member to a substantially uniform potential. The charged surface of the photoconductive member is thereafter exposed to a light image of an original document to selectively dissipate the charge thereon in selected areas irradiated by the light image. This procedure records an electrostatic latent image on the photoconductive member corresponding to the informational areas contained within the original document being reproduced. The latent image is then developed by bringing a developer material, including toner particles adhering triboelectrically to carrier granules into contact with the latent image. The toner particles are attracted away from the carrier granules to the latent image, forming a toner image on the photoconductive member which is subsequently transferred to a copy sheet. The copy sheet having the toner image thereon is then advanced to a fusing station for permanently affixing the toner image to the copy sheet in image configuration. In electrostatographic machines using a drum-type or an endless belt-type photoconductive member, the photosensitive surface thereof can contain more than one image at one time as it moves through various processing stations.

The portions of the photosensitive surface containing the projected images, so-called "image areas", are usually separated by a segment of the photosensitive surface called the inter-document space. After charging the photosensitive surface to a suitable charge level, the inter-document space segment of the photosensitive surface is generally discharged by a suitable lamp to avoid attracting toner particles at the development stations. Various areas on the photosensitive surface, therefore, will be charged to different voltage levels. For example, there will be the high voltage level of the initial charge on the photosensitive surface, a selectively discharged image area of the photosensitive surface, and a fully discharged portion of the photosensitive surface between the image areas.

The approach utilized for multicolor electrostatographic printing is substantially identical to the process described above. However, rather than forming a single latent image on the photoconductive surface in order to reproduce an original document, as in the case of black and white printing, multiple latent images corresponding to color separations are sequentially recorded on the photoconductive surface. Each single color electrostatic latent image is developed with toner of a color complimentary thereto and the process is repeated for differently colored images with the respective toner of complimentary color. Thereafter, each single color toner image can be transferred to the copy sheet in superimposed registration with the prior toner image, creating a multi-layered toner image on the copy sheet. Finally, this multi-layered toner image is permanently affixed to the copy sheet in a substantially conventional manner to form a finished color copy.

As described, the surface of the photoconductive member must be charged by a suitable device prior to exposing the photoconductive member to a light image. This operation is typically performed by a corona charging device. One type of corona charging device comprises a current carrying electrode enclosed by a shield on three sides and a wire grid or control screen positioned thereover, and spaced apart from the open side of the shield. Biasing potentials are applied to both the electrode and the wire grid to create electrostatic fields between the charged electrode and the shield, between the charged electrode and the wire grid, and between the charged electrode and the (grounded) photoconductive member. These fields repel electrons from the electrode and the shield resulting in an electrical charge at the surface of the photoconductive member roughly equivalent to the grid voltage. The wire grid is located between the electrode and the photoconductive member for controlling the charge strength and charge uniformity on the photoconductive member as caused by the aforementioned fields. Control of the field strength and the uniformity of the charge on the photoconductive member are very important because consistently high quality reproductions are best produced when a uniform charge having a predetermined magnitude is obtained on the photoconductive member.

A useful tool for measuring voltage levels on the photosensitive surface is an electrostatic voltmeter (ESV) or electrometer. The electrometer is generally rigidly secured to the reproduction machine adjacent the moving photosensitive surface and measures the voltage level of the photosensitive surface as it traverses an ESV probe. The surface voltage is a measure of the density of the charge on the photoreceptor, which is related to the quality of the print output. In order to achieve high quality printing, the surface potential on the photoreceptor at the developing zone should be within a precise range. In a typical xerographic charging system, the amount of voltage obtained at the point of electrostatic voltage measurement of the photoconductive member, namely at the ESV, is less than the amount of voltage applied at the wire grid of the point of charge application.

A fundamental challenge in designing an ESV is measuring a voltage in the 1 KV range without touching the surface being measured. Commercially available devices generally work in the 30 to 50 volt range. All commercially available ESVs including the Xerox designed units (such as disclosed in U.S. Pat. No. 5,489,850, entitled "Balance Beam Electrostatic Voltmeter Modulator Employing A Shielded Electrode and Carbon Fiber Conductors" are based on a nullbalance feedback system.

It is the object of the present invention to achieve, a "non-floating" i.e. "connected to ground" ESV. Generally, a circuit powered by a "floating" power supply, as shown in FIG. 4 is used to sense and process the modulated signal generated by a variable capacitance "modulator" or "probe". This modulator interrupts the electrostatic field generated between the surface being tested and the sense electrode, thus converting the DC voltage difference between that surface and the sensing electrode into an AC signal that is proportional to the voltage difference and the capacitance coupling. The capacitance is dependent on the spacing between the electrode and the surface under test. The result is an AC signal that is both voltage and spacing dependent. This signal is then processed by additional circuitry and converted to a DC voltage which drives a "high voltage stage" which is connected between ground and the floating circuit and which "drives" the floating circuit to the same voltage as that being sensed. Usually this is done by an integrating circuit in basic classical control form, as shown in FIG. 5.

The system has been "null balanced". The speed and accuracy of this processing is dependent on the "gain" of the system which is a function of the spacing and the modulation frequency. The common practice is to include an electronic "gain" adjustment to optimize the performance at the operating spacing.

Referring to FIG. 5, the system is dependent on having a high voltage output device 1; a high voltage power supply 2; a low voltage power supply 3 that floats at the voltage being measured and a low voltage power supply 4 referenced to earth ground. A cost analysis shows that a significant portion of the cost of the ESV is related to high voltage components, i.e. items 1, 2, and 3. Also, from classical control theory, the integral feedback system limits the overall speed of response to about 10 times the period of the modulation frequency. It is an object of the present invention to eliminate the need for these items.

It is also an object of the invention to utilize reliable, low cost, and potentially high precision micro sensors. For example, Polysilicon microbridges have been driven vertically and laterally as resonant microsensors. With respect to laterally driven microbridges, short displacements of a comb type drive of the type shown and described in U.S. Pat. No. 5,025,346, typically on the order of one to ten micrometers, lead to very weak sensed signals.

U.S. Pat. Nos. 6,177,800 and 5,517,123 disclose a Microelectromechanical Systems (MEMS) type noncontacting, electrostatic voltmeter (ESV) which is integrated with on-chip signal-processing circuits. The ESV works on the principle of intermittent shuttering and exposing a detector electrode to an electric field. The chopped electric field produces a small AC current in a detector circuit. Laterally driven polysilicon resonant microstructures are used as shutters in the integrated ESV. These resonant microshutters are electrostatically driven by interdigital comb fingers. See also Loconto, D. P. and Muller, R. S., "High-Sensitivity Micromechanical Electrostatic Voltmeter," 7th International Conference on Solid State Sensors and Actuators, 1993, pp. 878–881.

An object of the present invention is an ESV that utilizes a spacing compensating system. The system incorporates measuring the amplitude of each cycle, the speed of response is essentially the period of the modulation. Therefore, the Spacing Compensating ESV significantly reduces cost and significantly improves performance relative to the speed of response.

In accordance with one aspect of the present invention, there is provided an electrostatic type voltmeter for measuring the potential on a surface, the voltmeter including a probe; a support for supporting said probe in spaced relationship with said surface, said probe having a plurality of spacing element sites thereon for measuring a distance between each of said plurality of spacing element sites and a corresponding area on said surface opposite of each said plurality of spacing element sites; a plurality of electrostatic element sites, intermixed and adjacent to said plurality of spacing element sites on said probe, for measuring a voltage between each of said plurality of spacing element sites and an area on said surface adjacent to said corresponding area opposite of each said plurality of spacing element sites. A processor for compensating an output signal of said probe in response to the measurements received from said plurality of spacing element sites and said plurality of electrostatic element sites.

An advantageous feature of the present invention is that a distance compensation technique that enables the design of a lower cost electrostatic voltmeter based on MEMS Technology. The present invention proposes the measurement of the current flowing to the capacitor created by the spacing of the ESV to the voltage surface being measured. The present invention current varies proportionally to the spacing variations which also varies the measurement voltage output. Thus, the spacing current measurement can be used to compensate for the variations in measurement voltage caused by spacing variations thereby eliminating the need for high voltage feedback and high voltage power supply.

Other features of the present invention will become apparent as the following description proceeds and upon reference to the drawings.

The present invention is described hereinafter with respect to a preferred embodiment, it will be understood that this detailed description is not intended to limit the scope of the invention to that embodiment. On the contrary, the description is intended to include all alternatives, modifications and equivalents as may be considered within the spirit and scope of the invention as defined by the appended claims. For a general understanding of the features of the present invention, reference is made to the drawings wherein like references have been used throughout to designate identical elements.

Figure 1:
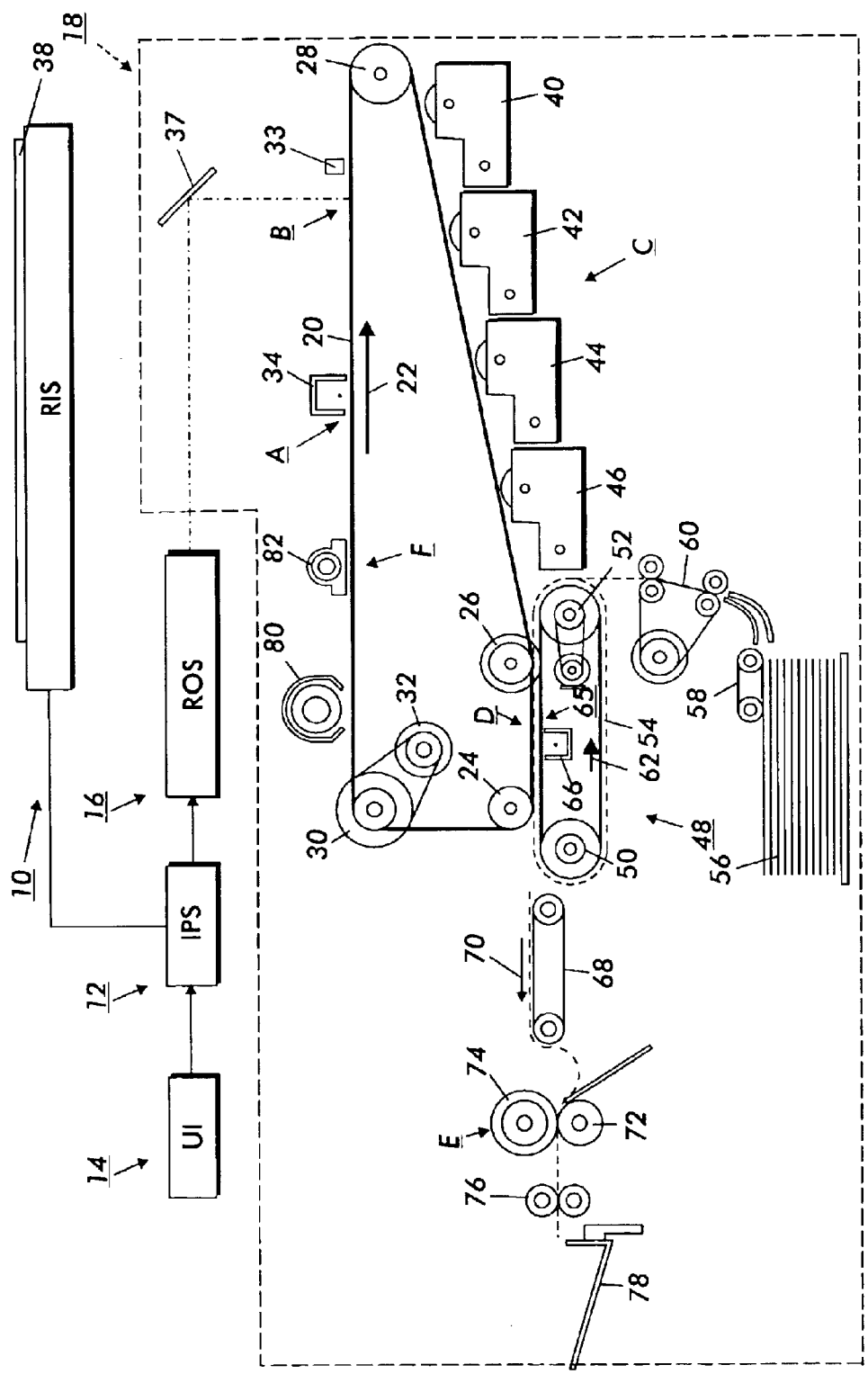
FIG. 1 is a schematic elevational view of an exemplary multicolor electrophotographic printing machine which can be utilized in the practice of the present invention.

A schematic elevational view showing an exemplary electrophotographic printing machine incorporating the features of the present invention therein is shown in FIG. 1. It will become evident from the following discussion that the present invention is equally well-suited for use in a wide variety of printing systems including ionographic printing machines and discharge area development systems, as well as other more general nonprinting systems providing multiple or variable outputs such that the invention is not necessarily limited in its application to the particular system shown herein.

Turning initially to FIG. 1, before describing the particular features of the present invention in detail, an exemplary electrophotographic copying apparatus will be described. The exemplary electrophotographic system may be a multicolor copier, as for example, the recently introduced Xerox Corporation "5775" copier. To initiate the copying process, a multi-color original document 38 is positioned on a raster input scanner (RIS), indicated generally by the reference numeral 10. The RIS 10 contains document illumination lamps, optics, a mechanical scanning drive, and a charge coupled device (CCD array) for capturing the entire image from original document 38. The RIS 10 converts the image to a series of raster scan lines and measures a set of primary color densities, i.e. red, green and blue densities, at each point of the original document. This information is transmitted as an electrical signal to an image processing system (IPS), indicated generally by the reference numeral 12, which converts the set of red, green and blue density signals to a set of colorimetric coordinates.

The IPS contains control electronics for preparing and managing the image data flow to a raster output scanner (ROS), indicated generally by the reference numeral 16. A user interface (UI), indicated generally by the reference numeral 14, is provided for communicating with IPS 12. UI 14 enables an operator to control the various operator adjustable functions whereby the operator actuates the appropriate input keys of UI 14 to adjust the parameters of the copy. UI 14 may be a touch screen, or any other suitable device for providing an operator interface with the system. The output signal from UI 14 is transmitted to IPS 12 which then transmits signals corresponding to the desired image to ROS 16.

ROS 16 includes a laser with rotating polygon mirror blocks. The ROS 16 illuminates, via mirror 37, a charged portion of a photoconductive belt 20 of a printer or marking engine, indicated generally by the reference numeral 18. Preferably, a multi-facet polygon mirror is used to illuminate the photoreceptor belt 20 at a rate of about 400 pixels per inch. The ROS 16 exposes the photoconductive belt 20 to record a set of three subtractive primary latent images thereon corresponding to the signals transmitted from IPS 12.

One latent image is to be developed with cyan developer material, another latent image is to be developed with magenta developer material, and the third latent image is to be developed with yellow developer material. These developed images are subsequently transferred to a copy sheet in superimposed registration with one another to form a multi-colored image on the copy sheet which is then fused thereto to form a color copy. This process will be discussed in greater detail hereinbelow.

With continued reference to FIG. 1, marking engine 18 is an electrophotographic printing machine comprising photoconductive belt 20 which is entrained about transfer rollers 24 and 26, tensioning roller 28, and drive roller 30. Drive roller 30 is rotated by a motor or other suitable mechanism coupled to the drive roller 30 by suitable means such as a belt drive 32. As drive roller 30 rotates, it advances photoconductive belt 20 in the direction of arrow 22 to sequentially advance successive portions of the photoconductive belt 20 through the various processing stations disposed about the path of movement thereof.

Initially, a portion of photoconductive belt 20 passes through a charging station, indicated generally by the reference letter A. At charging station A, a corona generating device 34 or other charging device generates a charge voltage to charge photoconductive belt 20 to a relatively high, substantially uniform voltage potential. The corona generator 34 comprises a corona generating electrode, a shield partially enclosing the electrode, and a grid disposed between the photoconductive belt 20 and the unenclosed portion of the electrode. The electrode charges the photoconductive surface of the belt 20 via corona discharge. The voltage potential applied to the photoconductive surface of the belt 20 is varied by controlling the voltage potential of the wire grid.

Next, the charged photoconductive surface is rotated to an exposure station, indicated generally by the reference letter B. Exposure station B receives a modulated light beam corresponding to information derived by RIS 10 having a multi-colored original document 38 positioned thereat. The modulated light beam impinges on the surface of photoconductive belt 20, selectively illuminating the charged surface of photoconductive belt 20 to form an electrostatic latent image thereon. The photoconductive belt 20 is exposed three times to record three latent images representing each color.

After the electrostatic latent images have been recorded on photoconductive belt 20, the belt is advanced toward a development station, indicated generally by the reference letter C. However, before reaching the development station C, the photoconductive belt 20 passes subjacent to a voltage monitor, preferably an electrostatic voltmeter 33, for measurement of the voltage potential at the surface of the photoconductive belt 20.

The electrostatic voltmeter 33 of the present invention provides the measuring condition in which charge is induced on a probe electrode corresponding to the sensed voltage level of the belt 20. The voltage potential measurement of the photoconductive belt 20 is utilized to determine specific parameters for maintaining a predetermined potential on the photoreceptor surface.

The development station C includes four individual developer units indicated by reference numerals 40, 42, 44, and 46. The developer units are of a type generally referred to in the art as "magnetic brush development units". Typically, a magnetic brush development system employs a magnetizable developer material including magnetic carrier granules having toner particles adhering triboelectrically thereto. The developer material is continually brought through a directional flux field to form a brush of developer material. The developer material is constantly moving so as to continually provide the brush with fresh developer material. Development is achieved by bringing the brush of developer material into contact with the photoconductive surface. Developer units 40, 42, and 44, respectively, apply toner particles of a specific color corresponding to the compliment of the specific color separated electrostatic latent image recorded on the photoconductive surface.

Each of the toner particle colors is adapted to absorb light within a preselected spectral region of the electromagnetic wave spectrum. For example, an electrostatic latent image formed by discharging the portions of charge on the photoconductive belt corresponding to the green regions of the original document will record the red and blue portions as areas of relatively high charge density on photoconductive belt 20, while the green areas will be reduced to a voltage level ineffective for development. The charged areas are then made visible by having developer unit 40 apply green absorbing (magenta) toner particles onto the electrostatic latent image recorded on photoconductive belt 20. Similarly, a blue separation is developed by developer unit 42 with blue absorbing (yellow) toner particles, while the red separation is developed by developer unit 44 with red absorbing (cyan) toner particles.

Figure 3:
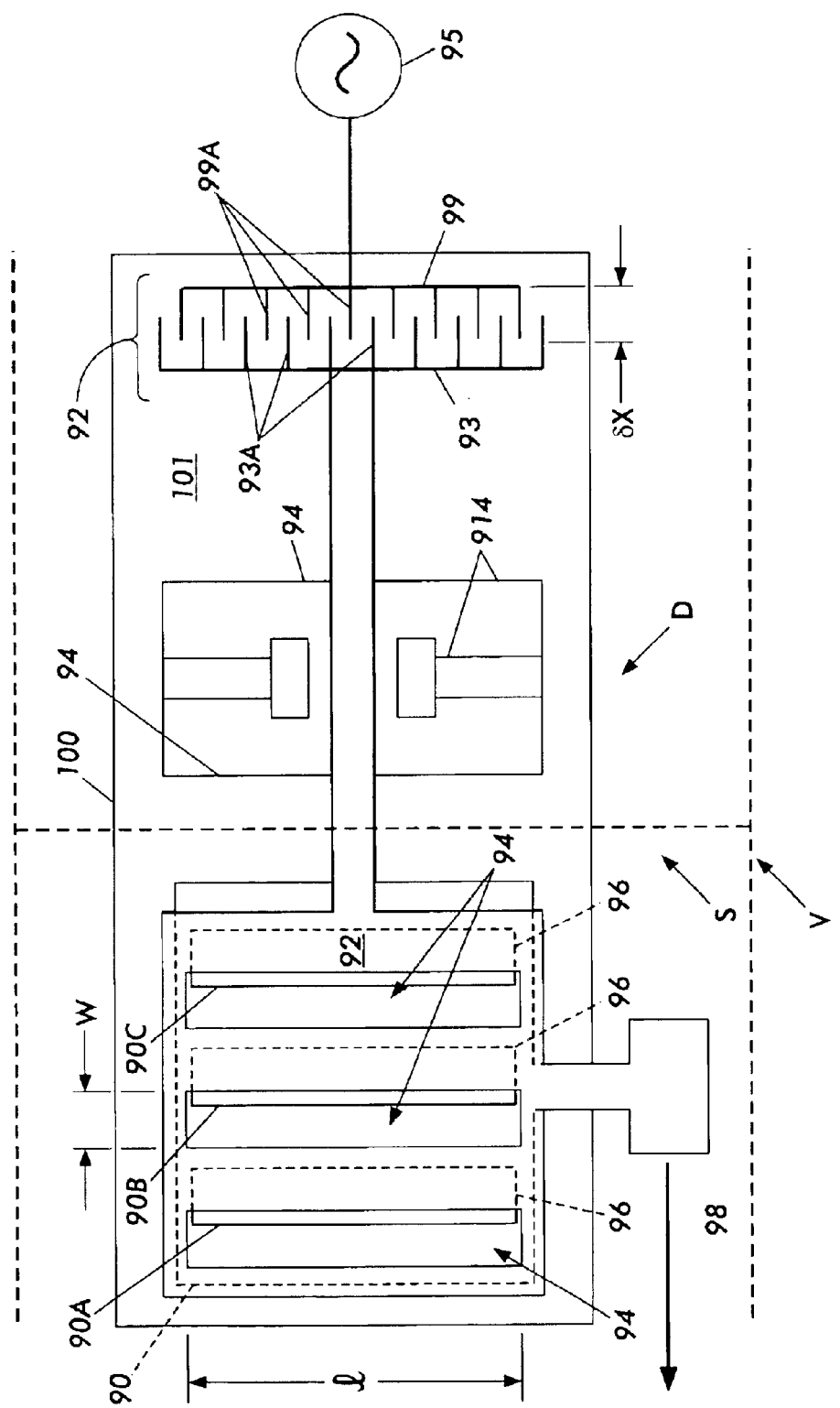
FIG. 3 is an enlarged view of a sensing site portion of the ESV of the present invention.

Developer unit 46 contains black toner particles and may be used to develop the electrostatic latent image formed from a black and white original document. In FIG. 3, developer unit 40 is shown in the operative position with developer units 42, 44, and 46 being in the non-operative position.

After development, the toner image is moved to a transfer station, indicated generally by the reference letter D. Transfer station D includes a transfer zone, generally indicated by reference numeral 64, defining the position at which the toner image is transferred to a sheet of support material, which may be a sheet of plain paper or any other suitable support substrate. A sheet transport apparatus, indicated generally by the reference numeral 48, moves the sheet into contact with photoconductive belt 20. Sheet transport 48 has a belt 54 entrained about a pair of substantially cylindrical rollers 50 and 52. A friction retard feeder 58 advances the uppermost sheet from stack 56 onto a pre-transfer transport 60 for advancing a sheet to sheet transport 48 in synchronism with the movement thereof so that the leading edge of the sheet arrives at a pre-selected position, i.e. a loading zone. The sheet is received by the sheet transport 48 for movement therewith in a recirculating path. As belt 54 of transport 48 moves in the direction of arrow 62, the sheet is moved into contact with the photoconductive belt 20, in synchronism with the toner image developed thereon.

In transfer zone 64, a corona generating device 66 sprays ions onto the backside of the sheet so as to charge the sheet to the proper magnitude and polarity for attracting the toner image from photoconductive belt 20 thereto. The sheet remains secured to the sheet gripper so as to move in a recirculating path for three cycles. In this manner, three different color toner images are transferred to the sheet in superimposed registration with one another.

Each of the electrostatic latent images recorded on the photoconductive surface is developed with the appropriately colored toner and transferred, in superimposed registration with one another, to the sheet for forming the multi-color copy of the colored original document.

After the last transfer operation, the sheet transport system directs the sheet to a vacuum conveyor, indicated generally by the reference numeral 68. Vacuum conveyor 68 transports the sheet, in the direction of arrow 70, to a fusing station, indicated generally by the reference letter E, where the transferred toner image is permanently fused to the sheet. The fusing station includes a heated fuser roll 74 and a pressure roll 72. The sheet passes through the nip defined by fuser roll 74 and pressure roll 72. The toner image contacts fuser roll 74 so as to be affixed to the sheet. Thereafter, the sheet is advanced by a pair of rolls 76 to a catch tray 78 for subsequent removal therefrom by the machine operator. The last processing station in the direction of movement of belt 20, as indicated by arrow 22, is a cleaning station, indicated generally by the reference letter F.

A lamp 80 illuminates the surface of photoconductive belt 20 to remove any residual charge remaining thereon. Thereafter, a rotatably mounted fibrous brush 82 is positioned in the cleaning station and maintained in contact with photoconductive belt 20 to remove residual toner particles remaining from the transfer operation prior to the start of the next successive imaging cycle.

The foregoing description should be sufficient for purposes of the present application for patent to illustrate the general operation of an electrophotographic printing machine incorporating the features of the present invention. As described, an electrophotographic printing system may take the form of any of several well-known devices or systems. Variations of specific electrophotographic processing subsystems or processes may be expected without affecting the operation of the present invention.

Referring now to the specific subject matter of the present invention, the operation thereof will be described hereinafter with reference to FIG. 2.

Figure 2:
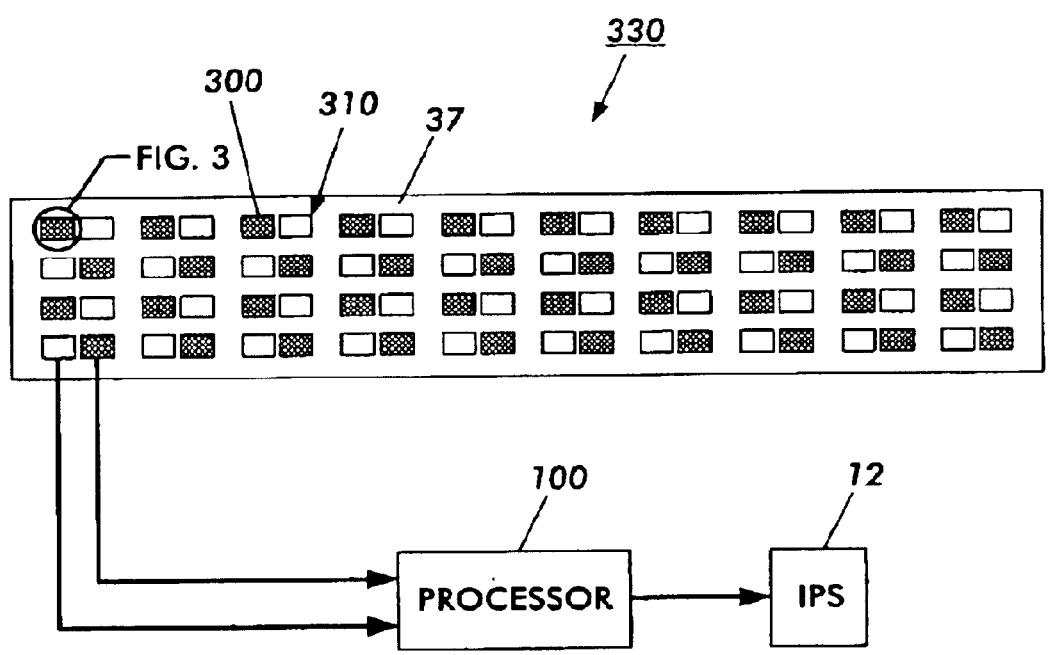
FIG. 2 is a schematic of the ESV of the present invention.

FIG. 2 illustrates a portion of the ESV probe head 330, the head contains an electrode structure having sensing sites. Sensing sites include a plurality of spacing sites 310 adjacent to a plurality of electrostatic sites 300. The spacing sites 310 measure the distance from the probe head and the photoconductive surface. The electrostatic sites 300 measure the voltage of the photoconductive surface. Each sensing site is individually addressable and sends its measurement data to a processor 100. Processor 100 determines a compensated voltage value from the measurement data and sends measurement data to IPS 12.

Figure 4:
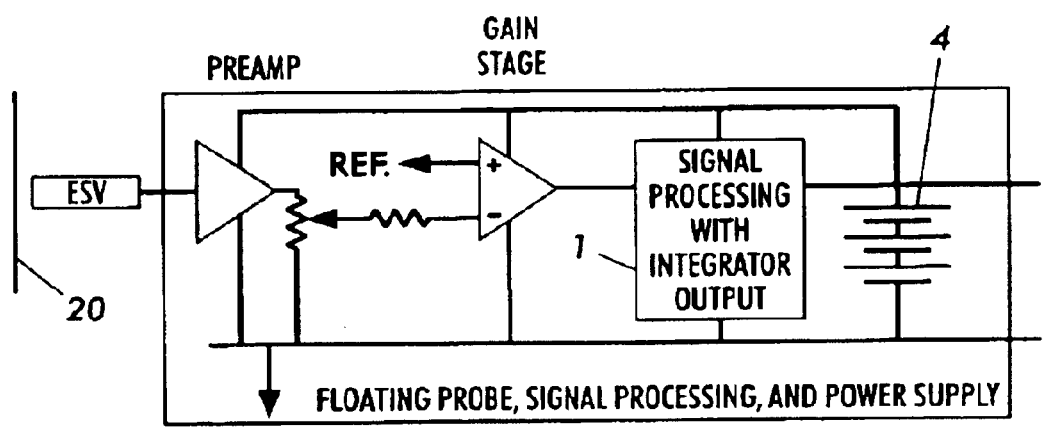
FIG. 4 is a schematic of a control circuit employed with the present invention.
Figure 5:
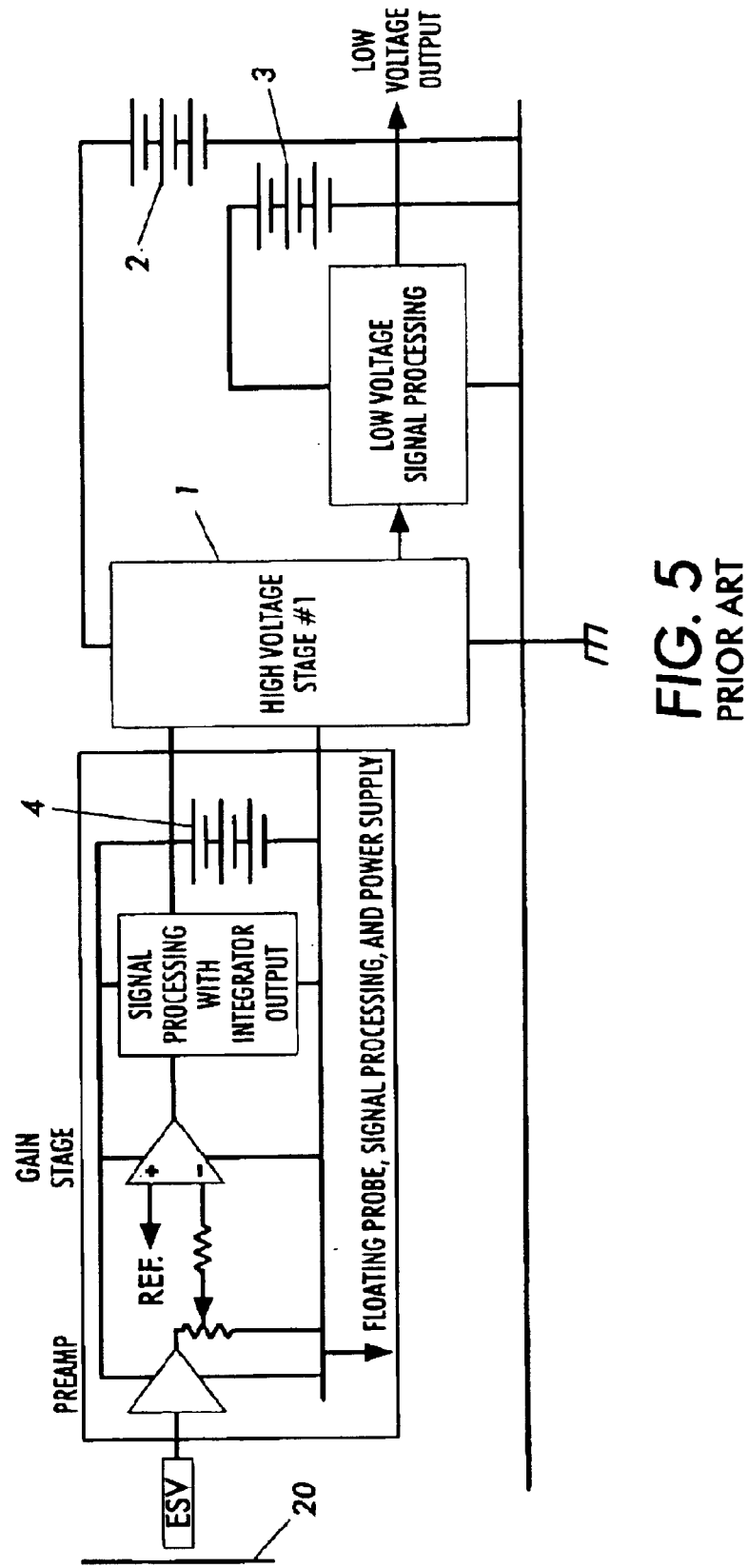
FIG. 5 is a schematic control circuit use with a prior art ESV.

Processor 350 includes a circuit powered by a "floating" power supply, as shown in FIG. 4, is used to sense and process the modulated signal generated by a variable capacitance "modulator" or "probe". This modulator interrupts the electrostatic field generated between the surface being tested and the sense electrode, thus converting the DC voltage difference between that surface and the sensing electrode into an AC signal that is proportional to the voltage difference and the capacitance coupling. The capacitance is dependent on the spacing between the electrode and the surface under test. The result is an AC signal that is both voltage and spacing dependent. This signal is then processed by additional circuitry and converted to a DC voltage which drives a "high voltage stage" which is connected between ground and the floating circuit and which "drives" the floating circuit to the same voltage as that being sensed.

The electrode structure having sensing sites is fabricated using Microelectronics allows easy replication of identical structures. Microelectronics technology is used to build an array of many small electrostatic sites along with an array of many matching spacing compensation sites on a single electrode structure. Then all sensing sites will behave the same and that the large number of sites will even out any discrepancies among them.

More specifically, and with particular reference to FIG. 3, which illustrates one sensing site, spacing sites 310 or electrostatic sites 300 in the array of sensing sites, having a sensor probe assembly that has a driver component D configured as a comb drive 92 with a cantilevered spring arrangement 94. The comb drive 92 is a common mechanism for electrostatically driving microstructures and includes a fixed side 16 attached to a printer or marking 18. The comb drive is electrically connected to an electrostatic drive signal source 95. A movable side 93 of the comb drive is held to, but above, the substrate 18 by the cantilevered spring user interface 14. A plurality of comb "fingers" 99a, 93a are interdigitated to provide electrical communication between the fixed side 99 and the movable side 93.

The length of these fingers define a maximum potential displacement, $\delta X$. The driver component D shown is FIG. 3 is understood to be merely a representative structure that would fulfill the objects of the present invention. However, other driver components are also encompassed by this disclosure such as magnetostatically and thermally driven microstructures among others.

Operatively associated or connected to the driver component D is the sensor component S. The driver component D is disposed opposite or linearly adjacent the sensor component, although it will be appreciated that other geometric arrangements may be used without departing from the scope and intent of the subject invention. A sense probe assembly 90 is fixed to the substrate 18 and is capable of capacitive coupling with a surface to be measured. The sense probe assembly is a set of spaced individual sense probes (represented here by numerals 90a, 90b, 90c, etc.) The individual sense probes are connected together so that individual signals are combined.

The sensor component S further comprises a movable shutter 92 that selectively overlays the sense probe assembly 90. Here, the shutter is mechanically connected to driver component D so that linear displacement of the driver component results in a corresponding displacement of the shutter.

The shutter 92 has a plurality or set of openings or windows 94 configured such that the sense probe assembly 90 is selectively exposed through the windows 94 when the shutter 92 is in a first position. The individual shutter openings are spaced from one another by a dimension matching the individual sense probe spacing. When the shutter 92 is in a second position, the sense probe assembly 90, or individual sense probes, is/are covered by the shutter regions 96 interposed between the windows. In other words, when the shutter 92 is in the first position, capacitive coupling by the sense probe assembly 90 is permitted. On the other hand, when the shutter is in the second position capacitive coupling by the sense probe assembly is masked or inhibited.

The current generated by the sense probe assembly 90 is output on line 98. The windows 34 define a length 1 and a width w. The width w is on the order of 10 .mu.m and is slightly less than the maximum potential displacement δX. Similarly, each shutter region 96 separating the windows is substantially equal to the maximum potential displacement δX.

The measurement of spacing with the spacing site is accomplished by connecting the electrodes to a "high frequency" current source (say 200 kHz to 500 KHz). The voltage across these electrodes will be inversely proportional to their capacitance and therefore will track the spacing with the same properties as the electrostatic measurements. The voltage being measured will be proportional to the product of the electrostatic output signal times the spacing output signal. It may also be necessary to apply some non-linear corrections. These calculations may be done either by well known standard analog circuitry functions or digital signal processing known to those skilled in the respective arts.

For example, the ASIC ESV modulator is currently shuttering a 1×4.5 mm electrode at 1 mm p-p travel and it is clear that more modulation is available. Suggested electrode size: 1×4.5 mm.

With these dimensions, a large number of sensing sites should be available by fabricating the electrode structure using standard microelectronic dimensions. These sites are interdigitated. Interconnecting of the sites is accomplished by standard microelectronic procedures.

This electrode structure results in a coupling to the photoreceptor of about 0.15 fF (0.15 e−15 F) (based on experimental results of the ASIC ESV's modulator). Effective electrode spacing: 2 mm min., 2 to 3 mm realistic spacing setting, 2–5 mm range. Modulation frequency is currently about 700 Hz; but 1 kHz has been demonstrated.

The signals from both electrostatic and spacing electrodes preferably are measured with circuits which do not load the 0.15 fF photoreceptor to electrode array impedance significantly and still maintain 0.1% overall accuracy (repeatability) over the spacing changes above.

Previous attempts to use "spacing compensating" measurements with a simple single element electrode have failed basically due to the problems of irregular surfaces, surface alignment, and "tracking" between electrostatic signals and spacing measurements. The advantageous feature of the present invention is the use of an interdigitated array structure which has a multiplicity of closely spaced spacing and electrostatic electrodes which overcomes the problems of the irregular surfaces and surface alignment between the electrostatic signals and spacing of measurements.

Figure 6:
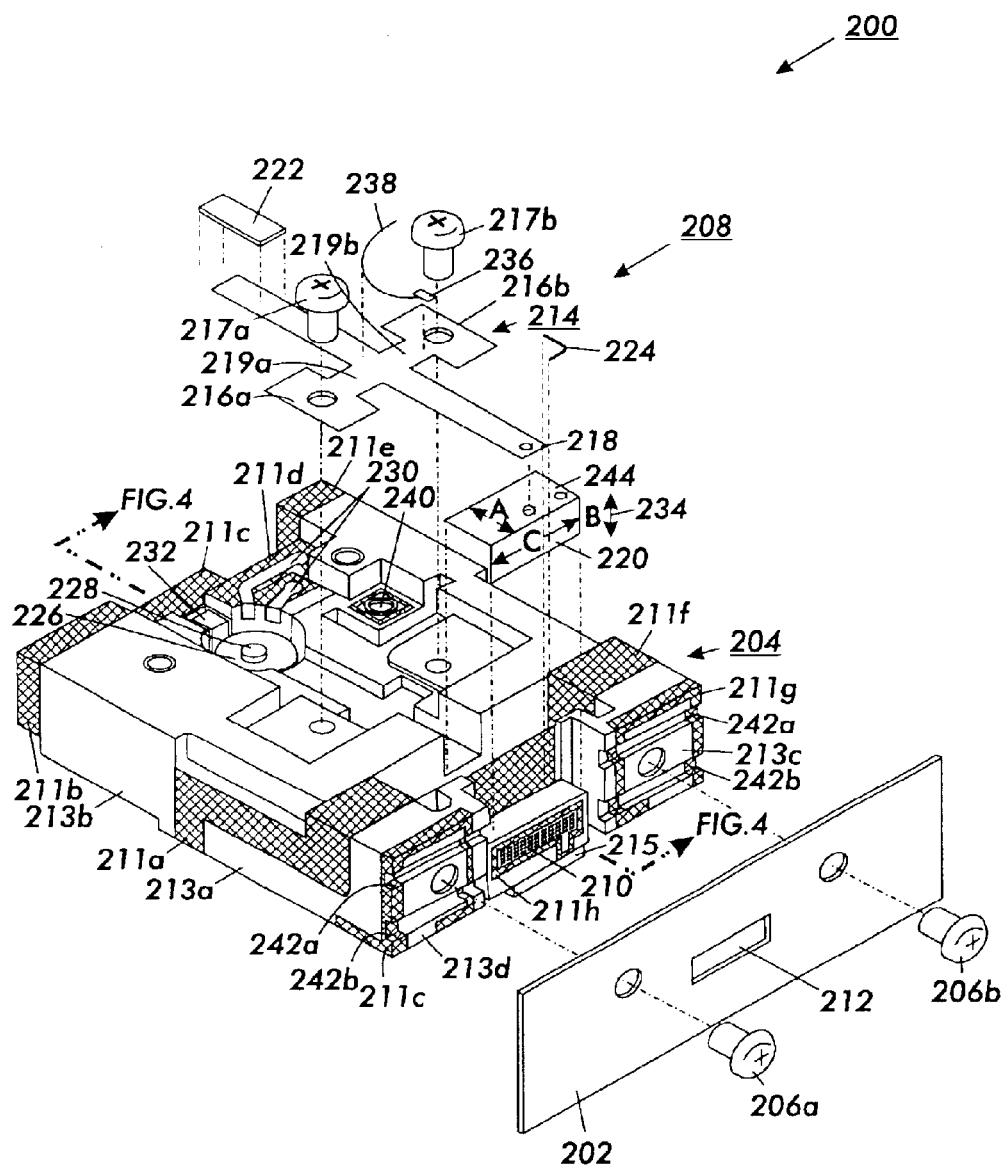
FIG. 6 is a schematic of a second embodiment of an ESV of the present invention.

Another system for obtaining the required signals is by utilizing a standard continuous shuttering action; the preferred modulator is an ASIC ESV modulator, as shown in FIG. 6. The conversion to a spacing compensating ESV is done by replacing the electrode 210 with an interdigitated electrode with both voltage and spacing sites.

Referring now to FIG. 6, the modulator assembly 200 has a front plate 202 which is attached to a modulator base 204 by fasteners 206(a–b). The assembly 200 includes a modulator 208 and a sensor electrode 210. The base 204 has insulating portions 211(a–i), schematically illustrated in FIG. 6 by surface shading, and shielding areas 213(a–d). The sensor electrode 210 may be any commonly known sensor element suitable for capacitance coupling with an electrostatic field external to the base 204. In this, a sensing aperture 212 is provided in the front plate 202 of the base 204 for permitting the sensing capacitance coupling. The sensing aperture 212 is disposed at a position that is proximate to the position of the sensor electrode 210. The sensor electrode 210 produces a signal which corresponds to the magnitude of the external electrostatic field for transmission, via a conducting strip 215, to an external voltmeter (not shown).

The modulator 208 includes a vibratory beam 214 having mounting supports 216(a–b) at a midpoint of the beam 214 for securely mounting the beam 214 within the base 204 with fasteners 217(a–b). The vibrating beam 214 includes a longitudinal arm element 218 and connecting or web portions 219(a–b), which are between the arm element 218 and the mounting supports 216(a–b) and connect the mounting supports 216(a–b) to the arm element 218. The arm element 218 has a device for interrupting the electrostatic voltage or chopper 220 at one end of the arm element 218 and a counterweight strip or slug 222 made of a magnetically susceptible material, such as Fe, which will close the magnetic path (hereinafter simply "counterweight"), at the other end. A carbon fiber wire 224 is provided for electrically connecting the chopper 220 with the front shielding area 213a. A magnetic coil 226 with a permanent magnet 228 and coil connections 230 are located under the vibratory beam 214 at an end of the arm element 218 carrying the counterweight 222. The magnetic coil 226 operates as a magnetic driver to drive the vibratory beam 214 to oscillate by the magnetic force applied to the counterweight 222 via the magnetic path from the magnet 228 to the counterweight 222 and through a ferrite core 232 returning to the magnet 228. In this, vibratory motion is generated in the arm element 218 and the web portions 219(a–b) of the vibratory beam 214, with the vibratory motion of the web portions 219(a–b) increasing toward the center of the vibratory beam 214, whereas vibratory motion is not produced in the mounting supports 216(a–b) of the vibratory beam 214, which are firmly attached to the modulator base 204 by the fasteners 217(a–b). Advantageously, the counterweight 222 balances the chopper 220 at the other end of the arm element 218 and is located on the arm 218 so as to maximize the magnetic flux of the ferrite core 232. When the arm element 218 is induced to vibrate by the magnetic coil 226, the chopper 220 oscillates in the directions indicated by arrows 234 in FIGS. 3 and 4. During the oscillation, the sensor electrode 210 repeatedly couples and decouples to an external electrostatic field as the chopper 220 passes the sensing aperture 212 in the front plate 202. Specifically, when the am, element 218 is vibrated or oscillated by influence of the magnetic flux of the ferrite core 232, the oscillation that results causes the chopper 220 to vibrate up and down across the sensing aperture 212 causing the sensor electrode 210 to couple and decouple with an external electrostatic field on a photoreceptor belt 14 through the sensing aperture 212.

Accordingly, oscillation of the arm element 218 results from the force applied by the magnetic coil 226, which functions as a magnetic driver for the vibratory element 208. A feedback crystal or piezoelectric pickup 236, advantageously located at one of the web portions 219(a–b) of the beam 214, senses the vibrations and generates feedback signals to a feedback control circuit (not shown). In this, the drive signals supplied to the magnetic coil 226 are regulated and the frequency and mode of the vibrations of the arm element 218 can be controlled. The feedback signals of the feedback crystal 236 are outputted via a Litz wire connection 238 soldered at 240.

While this invention has been described in conjunction with a specific embodiment thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. In an electrostatic type voltmeter for measuring the potential on a surface, the voltmeter including:

a probe;

support means for supporting said probe in spaced relationship with said surface, said probe having a plurality of spacing element sites thereon for measuring a distance between each of said plurality of spacing element sites and a corresponding area on said surface opposite of each said plurality of spacing element sites;

a plurality of electrostatic element sites, intermixed and adjacent to said plurality of spacing element sites on said probe, for measuring a voltage between each of said plurality of spacing element sites and an area on said surface adjacent to said corresponding area opposite of each said plurality of spacing element sites each of said plurality of electrostatic element sites includes:

a sensor component for measuring a voltage by capacitive coupling;

a movable shutter that selectively overlays the sensor component; and a shutter driver for opening and closing said movable shutter;

a modulator for shuttering each driver of each of said plurality of electrostatic element site independently from each other and means for compensating an output signal of said probe in response to the measurements received from said plurality of spacing element sites and said plurality of electrostatic element sites.

2. The voltmeter of claim 1, wherein said each of said plurality of spacing element sites includes:

a sensor component for measuring a voltage by capacitive coupling;

a movable shutter that selectively overlays the sensor component; and a shutter driver for opening and closing said movable shutter; and a processor for translating voltage measurement to a distance measurement to said surface.

3. The voltmeter of claim 2, further comprising a modulator for shuttering each driver of each of said plurality of spacing element sites independently from each other.

4. The voltmeter of claim 2, wherein said shutter defines a plurality of windows movable between a first position where the sensor component is exposed and a second position where the sensor component is covered, the shutter being adjacent to the sensor component.

5. The electrostatic voltmeter of claim 4, where the shutter driver comprises: a micro-electro-mechanical system having an electrostatic comb drive defining a maximum displacement ($.delta .x$) along an axis parallel to the comb fingers.

6. The electrostatic voltmeter of claim 5, where each of the plurality of windows defines a length (l) perpendicular to the comb fingers and a width (w) parallel to the comb fingers, the width being equal to the maximum displacement.

7. In an electrostatic type voltmeter for measuring the potential on a surface, the voltmeter including:

a probe;

support means for supporting said probe in spaced relationship with said surface, said probe having a plurality of spacing element sites thereon for measuring a distance between each of said plurality of spacing elements sites and a corresponding area on said surface opposite of each said plurality of spacing element sites;

a plurality of electrostatic element sites, intermixed and adjacent to said plurality of spacing element sites on said probe, for measuring a voltage between each of said plurality of spacing element sites and an area on said surface adjacent to said corresponding area opposite of each said plurality of spacing element sites; each of said plurality of electrostatic element sites includes:

a sensor component for measuring a voltage by capacitive coupling;

a movable shutter that selectively overlays the sensor component; and a shutter driver for opening and closing said movable shutter; and said shutter defines a plurality of windows movable between a first position where the sensor component is exposed and a second position where the sensor component is covered, the shutter being adjacent to the sensor component and means for compensating an output signal of said probe in response to the measurements received from said plurality of spacing element sites and said plurality of electrostatic element sites.

8. The electrostatic voltmeter of claim 7, where the shutter driver comprises: a micro-electro-mechanical system having an electrostatic comb drive defining a maximum displacement ($.delta .x$) along an axis parallel to the comb fingers.

9. The electrostatic voltmeter of claim 8, where each of the plurality of windows defines a length (l) perpendicular to the comb fingers and a width (w) parallel to the comb fingers, the width being equal to the maximum displacement.

* * * * *